US011729999B2

(12) United States Patent
Tortorelli et al.

(10) Patent No.: US 11,729,999 B2
(45) Date of Patent: *Aug. 15, 2023

(54) CAPACITIVE PILLAR ARCHITECTURE FOR A MEMORY ARRAY

(71) Applicant: Micron Technology, Inc., Boise, ID (US)

(72) Inventors: Innocenzo Tortorelli, Cernusco sul Naviglio (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/735,810

(22) Filed: May 3, 2022

(65) Prior Publication Data
US 2022/0262859 A1    Aug. 18, 2022

Related U.S. Application Data

(63) Continuation of application No. 17/119,038, filed on Dec. 11, 2020, now Pat. No. 11,342,382.

(51) Int. Cl.
  *G11C 13/00*    (2006.01)
  *H10B 63/00*    (2023.01)
  *H10N 70/20*    (2023.01)

(52) U.S. Cl.
  CPC ......... *H10B 63/845* (2023.02); *G11C 13/003* (2013.01); *G11C 13/0004* (2013.01);
  (Continued)

(58) Field of Classification Search
  CPC ... H01L 27/249; H01L 27/2454; H01L 45/06; G11C 13/0004; G11C 13/003; G11C 2213/75; G11C 2213/71
  (Continued)

(56) References Cited

U.S. PATENT DOCUMENTS 9,502,471 B1    11/2016    Lu et al.
9,972,641 B1    5/2018    Zhang et al.
(Continued)

FOREIGN PATENT DOCUMENTS

TW    201733023 A    9/2017
TW    201937770 A    9/2019

OTHER PUBLICATIONS

"International Search Report and Written Opinion of the International Searching Authority," issued in connection with Int'l Appl. No. PCT/US21/72673, dated Mar. 23, 2022 (11 pages).
(Continued)

*Primary Examiner* — Michael T Tran
(74) *Attorney, Agent, or Firm* — Holland & Hart LLP

(57) ABSTRACT

Methods, systems, and devices for a capacitive pillar architecture for a memory array are described. An access line within a memory array may be, include, or be coupled with a pillar. The pillar may include an exterior electrode, such as a hollow exterior electrode, surrounding an inner dielectric material that may further surround an interior, core electrode. The interior electrode may be maintained at a voltage level during at least a portion of an access operation for a memory cell coupled with the pillar. Such a pillar structure may increase a capacitance of the pillar, for example, based on a capacitive coupling between the interior and exterior electrodes. The increased capacitance may provide benefits associated with operating the memory array, such as increased memory cell programming speed, programming reliability, and read disturb immunity.

19 Claims, 7 Drawing Sheets

(52) U.S. Cl.
CPC ........... *H10B 63/34* (2023.02); *H10N 70/231* (2023.02); *G11C 2213/71* (2013.01); *G11C 2213/75* (2013.01)

(58) Field of Classification Search
USPC ............................................ 365/163, 185.24
See application file for complete search history.

(56) References Cited

U.S. PATENT DOCUMENTS

| | | | |
|---|---|---|---|
| 10,115,897 B1 * | 10/2018 | Sato | .................... H01L 45/1226 |
| 10,192,878 B1 | 1/2019 | Tsutsumi et al. | |
| 10,937,479 B1 | 3/2021 | Beery et al. | |
| 11,342,382 B1 * | 5/2022 | Tortorelli | .............. H01L 27/249 |
| 2010/0059811 A1 | 3/2010 | Sekine et al. | |
| 2011/0031550 A1 | 2/2011 | Komori et al. | |
| 2012/0213009 A1 | 8/2012 | Aritome et al. | |
| 2012/0319072 A1 | 12/2012 | Wei et al. | |
| 2013/0292630 A1 * | 11/2013 | Sasago | ............... G11C 13/0007 257/4 |
| 2014/0353571 A1 * | 12/2014 | Liu | ...................... H10N 70/231 257/4 |
| 2015/0243885 A1 | 8/2015 | Sciarrillo | |
| 2015/0255512 A1 | 9/2015 | Takagi et al. | |
| 2015/0340406 A1 | 11/2015 | Jo | |
| 2016/0056208 A1 | 2/2016 | Pellizzer et al. | |
| 2016/0133642 A1 | 5/2016 | Jeon et al. | |
| 2016/0163729 A1 | 6/2016 | Zhang et al. | |
| 2017/0054074 A1 * | 2/2017 | Sasago | ................. H10N 70/826 |
| 2017/0117035 A1 | 4/2017 | Mokhlesi et al. | |
| 2017/0148517 A1 | 5/2017 | Harari | |
| 2017/0243919 A1 | 8/2017 | Seong et al. | |
| 2018/0114794 A1 | 4/2018 | Jang et al. | |
| 2018/0138194 A1 | 5/2018 | Shigemura et al. | |
| 2018/0138241 A1 * | 5/2018 | Pellizzer | ............... H01L 45/141 |
| 2018/0323208 A1 | 11/2018 | Sugino et al. | |
| 2018/0358102 A1 | 12/2018 | Zhang et al. | |
| 2019/0157345 A1 | 5/2019 | Zhu et al. | |
| 2019/0252361 A1 | 8/2019 | Nishida | |
| 2019/0259946 A1 | 8/2019 | Makala et al. | |
| 2019/0267428 A1 | 8/2019 | Wu | |
| 2019/0287979 A1 | 9/2019 | Hirayama et al. | |
| 2020/0006427 A1 | 1/2020 | Sato et al. | |
| 2020/0161547 A1 | 5/2020 | Ok et al. | |
| 2020/0295031 A1 | 9/2020 | Lue | |
| 2020/0343307 A1 | 10/2020 | Lee et al. | |
| 2020/0395373 A1 | 12/2020 | Huo et al. | |
| 2021/0091102 A1 | 3/2021 | Zhu et al. | |
| 2021/0159409 A1 | 5/2021 | Miao et al. | |
| 2021/0167128 A1 | 6/2021 | Ando et al. | |
| 2021/0399052 A1 | 12/2021 | Wu et al. | |
| 2021/0408375 A1 | 12/2021 | Dorow et al. | |

OTHER PUBLICATIONS

Taiwan Patent Office, "Office Action and Search Report", issued in connection with Taiwan Patent Application No. 110146248 dated Sep. 28, 2022 (6 pages).

* cited by examiner

CAPACITIVE PILLAR ARCHITECTURE FOR A MEMORY ARRAY

CROSS REFERENCE

The present application for patent is a continuation of U.S. patent application Ser. No. 17/119,038 by Tortorelli et al., entitled "CAPACITIVE PILLAR ARCHITECTURE FOR A MEMORY ARRAY" and filed Dec. 11, 2020, which is assigned to the assignee hereof and is expressly incorporated by reference in its entirety herein.

FIELD OF TECHNOLOGY

The following relates generally to one or more systems for memory and more specifically to capacitive pillar architecture for a memory array.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
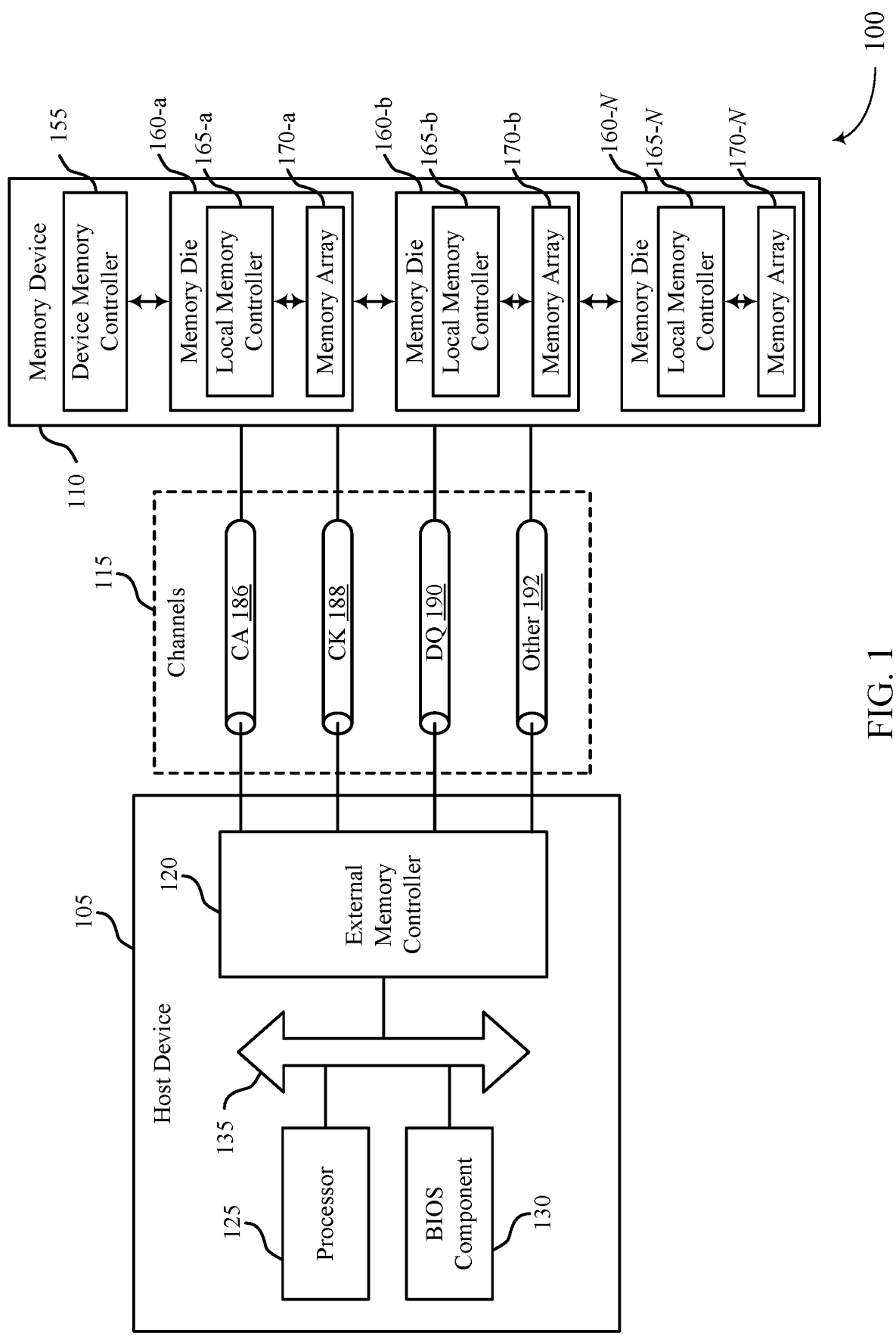
FIG. 1 illustrates an example of a system that supports a capacitive pillar architecture for a memory array in accordance with examples as disclosed herein.

For some types of memory devices, a balance between capacitances (e.g., parasitic capacitances) associated with one type of access lines (e.g., word lines) and another type of access lines (e.g., bit lines) may be desirable. Additionally or alternatively, for some types of memory devices, a current associated with accessing a memory cell (e.g., a current that may pass through the memory cell when the memory cell is accessed) or some other current associated with operating the memory device may depend in part on a magnitude of the capacitance of one or more access lines coupled with the memory cell, a balance between capacitances associated with access lines coupled with the memory cell, or both. For example, a programming speed, a programming reliability (e.g., a threshold voltage stability in a high threshold voltage state), a read disturb immunity, or some other operating characteristic for a memory cell may be based on the magnitude, duration, or both of a current used when programming (e.g., writing) or reading the memory cell or another memory cell in the same memory device, and such characteristics of the current may depend on the capacitance of one or more access lines within the memory device.

In some cases, an access line within a memory array may include a pillar structure (e.g., a solid electrode pillar), where the pillar structure may have a lower capacitance relative to one or more other access lines within the memory array based on, for example, a relatively shorter length of the pillar structure or a relative electrical isolation of the pillar structure. This may result in a capacitive imbalance between the access line corresponding to the pillar structure and one or more other access lines within the memory array (e.g., which may have longer or more planar geometries). Such a relatively lower capacitance or imbalance associated with the pillar structure may adversely impact one or more aspects of memory device operation (e.g., may result in an undesirably low current through or otherwise associated with accessing a memory cell coupled with the pillar structure when the memory cell is accessed), such as programming speed, programming reliability, or read disturb immunity for associated memory cells, among other drawbacks that may be appreciated by one of ordinary skill in the art.

The present disclosure provides techniques for increasing the capacitance of an access line having a pillar structure within a memory array, better supporting control (e.g., tuning) of such a capacitance as part of a fabrication process, or both, which may have various performance benefits related to programming speed, programming reliability, or read disturb immunity for associated memory cells, among other drawbacks that may be appreciated by one of ordinary skill in the art.

For example, an access line may have a pillar structure that includes an exterior electrode (e.g., a hollow exterior electrode) at least partially surrounding an inner dielectric material (e.g., encircle or otherwise surround at least the sidewalls of), where the dielectric material may further at least partially surround an interior electrode (e.g., a core electrode) that may be maintained at a voltage level (e.g., a ground voltage). This pillar structure may provide an increased or otherwise more configurable capacitance of the pillar (e.g., relative to a solid pillar), for example, based on a capacitive coupling between the interior and exterior electrodes. An increased pillar capacitance may increase the magnitude of a current associated with accessing a memory cell coupled with the pillar and thereby, for example, increase cell programming speed and programming reliability, as well as read disturb immunity. Additionally or alternatively, such a pillar structure may balance (e.g., more closely align or otherwise reduce differences between) capacitances associated with one type of access line within the memory device (e.g. word lines) and another type of access line within the memory die (e.g., bit lines) that may include or be coupled with the pillar, which may support further optimizations or provide other benefits as may be appreciated by one of ordinary skill in the art.

Features of the disclosure are initially described in the context of memory systems, dies, and arrays as described with reference to FIGS. 1-3. Features of the disclosure are described in the context of device architectures as described with reference to FIGS. 4 and 5. These and other features of the disclosure are further illustrated by and described with reference to an apparatus diagram and flowcharts that relate to capacitive pillar architecture for a memory array as described with references to FIGS. 6 and 7.

FIG. 1 illustrates an example of a system 100 that supports a capacitive pillar architecture for a memory array in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store at least one bit of data. For example, a memory array 170 may include memory cells arranged within an array architecture as described elsewhere herein. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a row line or column line. For example, a pillar (e.g., representing an access line such as a bit line or a component thereof) may extend through multiple decks of memory cells, and may be coupled with at least one memory cell of each deck.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

A memory controller as described herein (e.g., a device memory controller 155 or a local memory controller 165) may be operable to perform or initiate one or more access operations for memory cells of the memory device 110. For example, the memory controller may activate multiple access lines to access one or more memory cells for a read or write operation.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

As described herein, an access line (e.g., for performing access operations) may be or include a pillar, and the pillar may include an exterior electrode (e.g., a hollow exterior electrode) at least partially surrounding an inner dielectric (e.g., encircle or otherwise surround at least the sidewalls of), where the dielectric may further at least partially surround an interior electrode (e.g., a core electrode). The inner electrode may be maintained (e.g., biased) at a voltage level (e.g., a ground voltage). Such a pillar structure may increase a capacitance of the pillar, for example, based on a capacitive coupling between the interior electrode and exterior electrode. The increased capacitance may increase one or more current associated with accessing memory cells associated with the pillar (e.g., coupled with the pillar), such as discharge currents that may occur through such memory cells when accessed, and thereby increase cell programming speed, programming reliability, and read disturb immunity (e.g., during an access operation).

Figure 2:
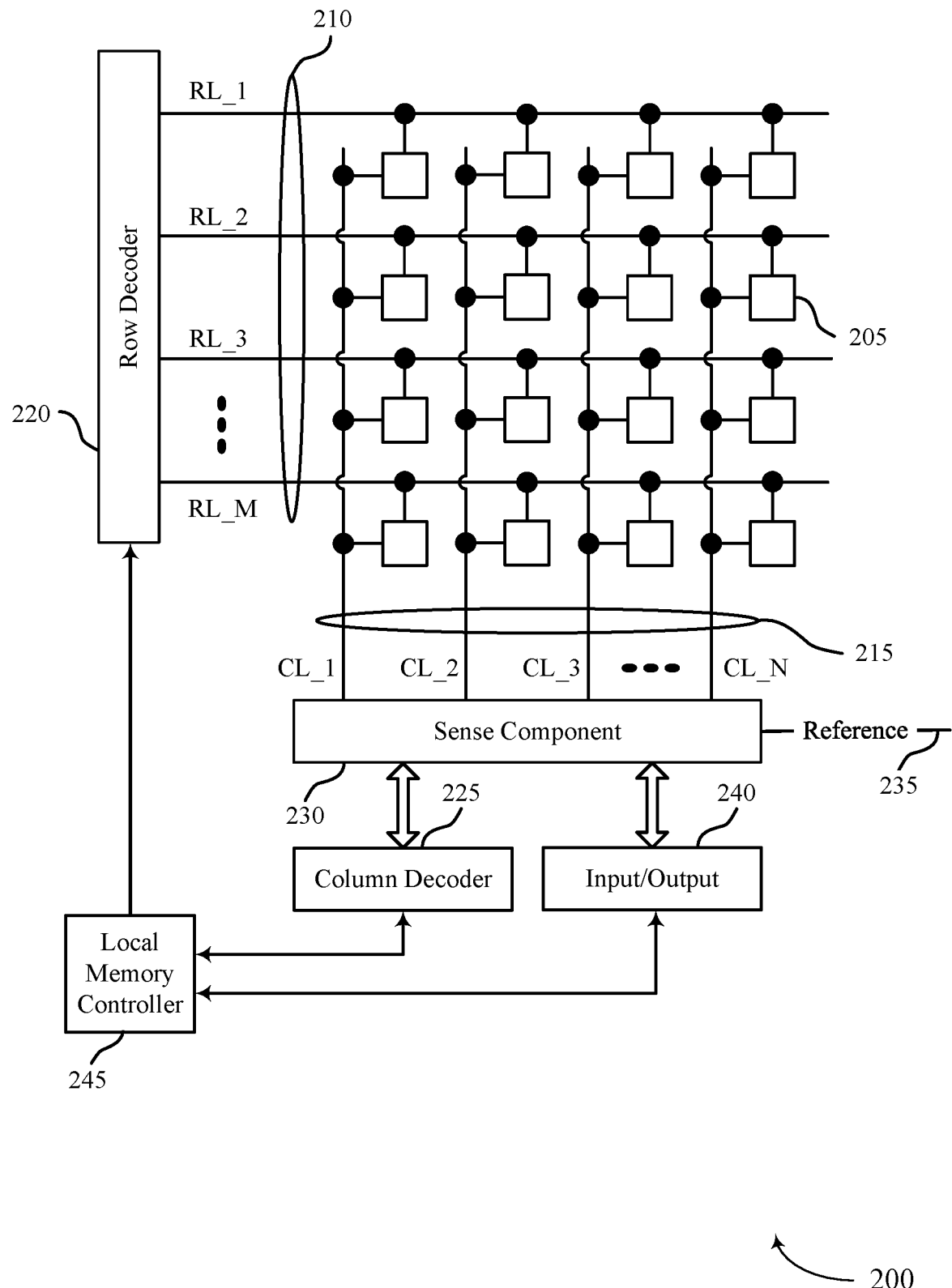
FIG. 2 illustrates an example of a memory die that supports a capacitive pillar architecture for a memory array in accordance with examples as disclosed herein.

FIG. 2 illustrates an example of a memory die 200 that supports a capacitive pillar architecture for a memory array in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1. FIG. 2 may illustrate various features related to the electrical operation of a memory array, but in some examples, the physical location and configuration of components may deviate from the depiction in FIG. 2.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include access lines (e.g., row lines 210 and column lines 215). Access lines may be formed of one or more conductive materials. In some examples, row lines 210 may be referred to as word lines. In some examples, column lines 215 may be referred to as digit lines or bit lines. In some cases, additional types of access lines may be present as described elsewhere herein. References to access lines, row lines, column lines, word lines, digit lines, or bit lines, or their analogues, are interchangeable without loss of understanding or operation. Memory cells 205 may be positioned, for example, at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 245 and activate a row line 210 (e.g., an access line such as a word line) based on the received row address. A column decoder 225 may receive a column address from the local memory controller 245 and may activate a column line 215 based on the received column address (e.g., an access line such as a pillar or a bit line, which may be activated via a source line and a pillar line, among other examples).

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200. In some cases, the sense component 230 may be coupled with other components as shown in FIG. 2 (e.g., coupled with the column decoder 225 and electrically located between the column decoder 225 and the one or more memory cells 205). In some other cases, the relative positions of the sense component 230 and the column decoder 225 may be reversed (e.g., the sense component 230 may be coupled with the column decoder and electrically located between the column decoder 225 and the local memory controller 245).

The local memory controller 245 may control the accessing of memory cells 205 through the various components (e.g., row decoder 220, column decoder 225, sense component 230). The local memory controller 245 may be an example of the local memory controller 165 described with reference to FIG. 1. In some examples, one or more of the row decoder 220, column decoder 225, and sense component 230 may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address signals to activate the target row line 210 and the target column line 215. The local memory controller 245 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

The local memory controller 245 may be operable to perform a write operation (e.g., a programming operation) on one or more memory cells 205 of the memory die 200. During a write operation, a memory cell 205 of the memory die 200 may be programmed to store a desired logic state. The local memory controller 245 may identify a target memory cell 205 on which to perform the write operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The local memory controller 245 may apply a specific signal (e.g., write pulse) to the column line 215 during the write operation to store a specific state in the storage element of the memory cell 205. The pulse used as part of the write operation may include one or more voltage levels over a duration.

The local memory controller 245 may be operable to perform a read operation (e.g., a sense operation) on one or more memory cells 205 of the memory die 200. During a read operation, the logic state stored in a memory cell 205 of the memory die 200 may be determined. The local memory controller 245 may identify a target memory cell 205 on which to perform the read operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, and/or a resistance or threshold characteristic of the memory cell 205. The sense component 230 may amplify the signal. The local memory controller 245 may activate the sense component 230 (e.g., latch the sense component) and thereby compare the signal received from the memory cell 205 to the reference signal 235. Based on that comparison, the sense component 230 may determine a logic state that is stored on the memory cell 205. The pulse used as part of the read operation may include one or more voltage levels over a duration.

As further described and illustrated elsewhere herein, a memory array may include pillars, which may correspond (e.g., may correspond in terms of electrical function) to column lines 215. Row lines 210 may extend horizontally (e.g., parallel to a substrate), and a memory array may include multiple levels (e.g., planes, decks) of row lines 210, each coupled with memory cells 205 within a corresponding level (e.g., plane, deck). For example, the row lines 210 illustrated in FIG. 2 may correspond to one level of row lines 210, with other levels of row lines 210 vertically above or below the illustrated row lines 210. The pillars may extend vertically (e.g., orthogonal to the substrate) through one or more levels of row lines 210. As described in greater detail elsewhere herein, a pillar may be coupled with a corresponding pillar selector (e.g., one or more transistors), and a pillar may be selectively activated (e.g., driven to a select or access voltage) based on the corresponding pillar selector being activated or deactivated. For example, a pillar selector may be coupled with one or more corresponding access lines (e.g., pillar lines, source lines), which may be selectively activated or deactivated by one or more corresponding decoders (e.g., which may functionally correspond to the column decoder 225 and be described as pillar decoders), and when a pillar selector is activated, the corresponding pillar may be driven to a desired voltage based on driving an access line coupled with the pillar selector to the desired voltage.

As described herein, a pillar may include an exterior electrode (e.g., a hollow exterior electrode) at least partially surrounding an inner dielectric (e.g., encircle or otherwise surround at least the sidewalls of), where the dielectric may further at least partially surround an interior electrode (e.g., a core electrode). In some cases, the interior electrode may be maintained at a voltage level (e.g., a ground voltage). Such a pillar structure may increase a capacitance of the pillar, for example, based on a capacitive coupling between the interior electrode and exterior electrode. The increased capacitance may increase one or more currents associated with accessing memory cells associated with the pillar (e.g., coupled with the pillar), such as discharge currents that may occur through such memory cells when accessed, and thereby increase cell programming speed, programming reliability, and read disturb immunity (e.g., during an access operation). Additionally or alternatively, such a pillar structure may balance (e.g., more closely align or otherwise reduce differences between) capacitances associated with one type of access line within the memory die (e.g. row lines 210) and another type of access line within the memory die (e.g., column lines 215), which may support further optimizations or provide other benefits as may be appreciated by one of ordinary skill in the art.

Figure 3:
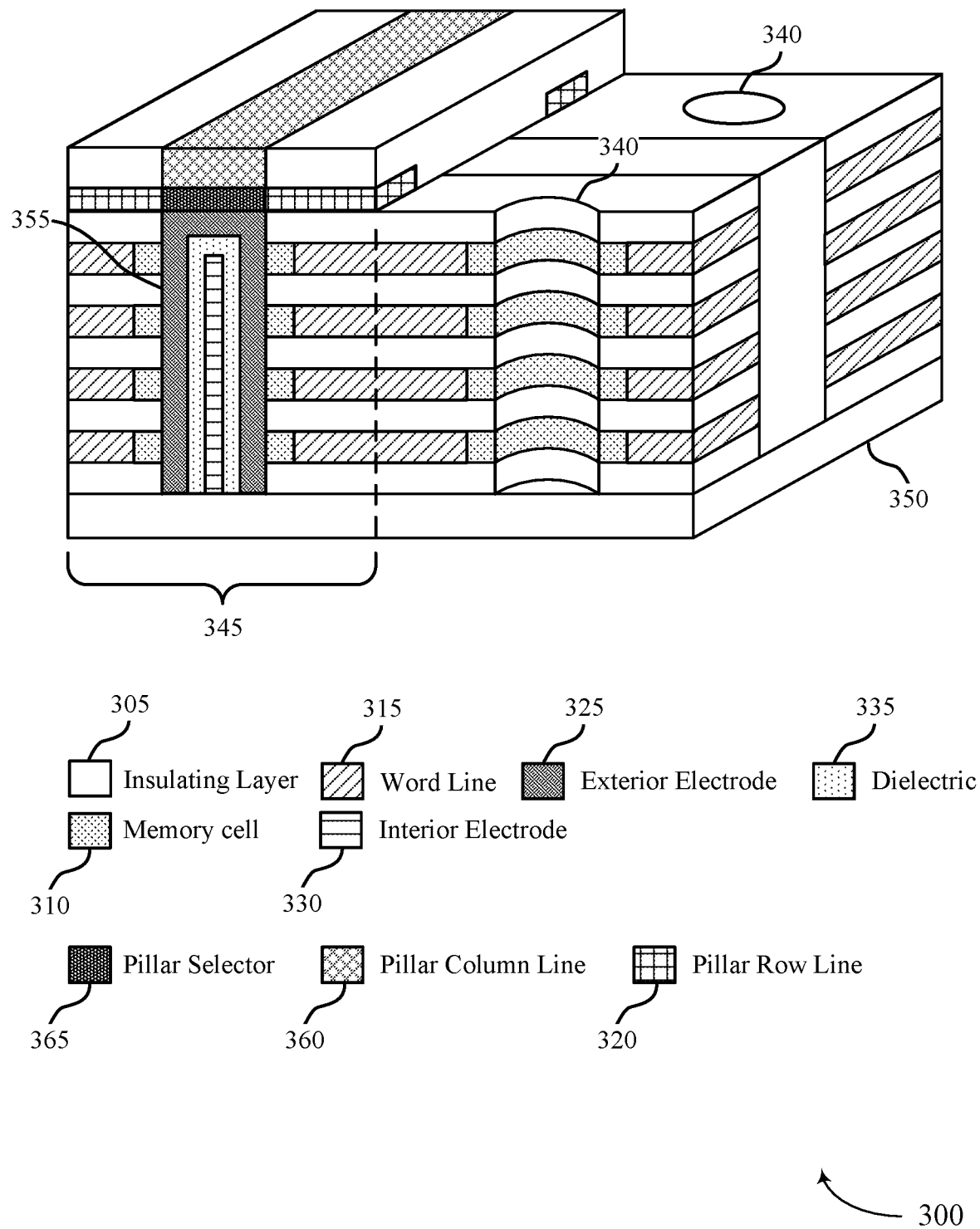
FIG. 3 illustrates an example of a memory array that supports a capacitive pillar architecture for a memory array in accordance with examples as disclosed herein.

FIG. 3 illustrates an example of a memory array 300 in accordance with examples as disclosed herein. Memory array 300 may be an example of memory array described with reference to FIGS. 1 and 2. Memory array 300 may include multiple levels of memory cells 310 stacked in a vertical direction, relative to a substrate, to create memory cell stacks 345, which may be examples of a memory cell and memory cell stack as described with reference to FIGS. 1 and 2. Memory array 300 may thus be referred to, in some examples, as a 3D memory array. Memory array 300 may include word lines 315 and pillars 355, which may be examples of word lines and bit lines as described with reference to FIG. 2. Memory array 300 may also include insulating layers 305, vias 340, substrate 350, pillar selectors 365, pillar column lines 360, and pillar row lines 320.

Each pillar 355 may include an exterior electrode 325, an interior electrode 330, and a dielectric 335. The exterior electrodes 325 may each be selectively couplable with a respective pillar row line 320 (e.g., which may alternatively be referred to as a source line) via a respective pillar selector 365 (e.g., a transistor or a switching component). For example, a pillar column line 360 for a pillar 355 may be coupled with the pillar selector 365 for the pillar 355, and based on the voltage of the pillar column line 360 (e.g., a voltage differential between the voltage of the pillar column line 360 and the voltage of the pillar row line 320), the pillar selector 365 may be selectively activated or deactivated. When activated (e.g., on, closed, conducting), the pillar selector 365 for a pillar 355 may couple the exterior electrode 325 of the pillar 355 with the pillar row line 320 for the pillar 355, and thus the voltage of the exterior electrode 325 may become equal or approximately equal to the voltage of the pillar row line 320. In some cases, a pillar selector 365 may be a transistor (e.g., a thin-film transistor (TFT) or other type of transistor), and a gate of the transistor may be coupled with the pillar column line 360 and a source of the transistor may be coupled with the pillar row line 320. Hence, in some cases, a pillar column line 360 may alternatively be referred to herein as a pillar gate line or as a pillar line, and a pillar row line 320 may alternatively be referred to in some cases as a pillar source line or as a source line. A pillar decoder may be operable to selectively activate (e.g., apply a selection voltage to) or deactivate (e.g., apply a deselection voltage to) a pillar column line 360 out of a set of pillar column lines 360 associated with the pillar decoder, or to selectively activate (e.g., apply a selection voltage to)

or deactivate (e.g., apply a deselection voltage to) a pillar row line 320 out of a set of pillar row lines 320 associated with the pillar decoder.

One of ordinary skill in the art will appreciate that what direction (e.g., the X or Y direction) is considered a row versus a column may be arbitrary, and that pillar column lines 360 and pillar row lines 320 each may extend in any direction relative to other aspects of the memory array 300. Further, while the example of FIG. 3 illustrates pillar selectors 365, pillar row lines 320, and pillar column lines 360 as above the pillars 355, pillar selectors 365, pillar row lines 320, and pillar column lines 360 may alternatively be below the pillars 355 (e.g., between the pillars 355 and the substrate 350) in some implementations.

In some cases, a pillar 355 (or an exterior electrode 325 thereof) may correspond (e.g., in terms of one or more functionalities) to a column line 215 as described with reference to FIG. 2. Similarly, pillar decoders, pillar column lines 360, pillar row lines 320, and pillar selectors 365 may correspond (e.g., in terms of one or more functionalities) to a column decoder 225 as described with reference to FIG. 2. Additionally or alternatively, a pillar row line 320 may be considered as corresponding (e.g., in terms of one or more functionalities) to a column line 215 as described with reference to FIG. 2, with a pillar 355 (or an exterior electrode 325 thereof) considered a selectable extension of the pillar row line 320.

Memory array 300 may also include insulating layers 305, which may be electrically insulating. As described herein, various logic states may be stored by programming the electrical resistance of memory cells 310. In some cases, programming the electrical resistance includes passing a current through memory cell 310, heating memory cell 310, melting the material of memory cell 310 (e.g., wholly or partially), applying a voltage of a particular polarity to the memory cell, or any combination thereof. Insulating layers 305 may be composed of multiple sublayers, creating one or more interfaces between memory cells 310.

Memory array 300 may include an array of memory cell stacks 345, and each memory cell stack 345 may include multiple memory cells 310. Memory array 300 may be made by forming a stack of conductive layers, such as word lines 315, where each conductive layer may be separated from an adjacent conductive layer by one or more electrically insulating layers 305. The electrically insulating layers may include oxide or nitride materials, such as silicon oxide, silicon nitride, or other electrically insulating materials. In some cases, electrically insulating layers 305 may include one or more sublayers. The layers of memory array 300 may be formed on a substrate 350, such as a silicon wafer, or any other semiconductor or oxide substrate. Vias 340 may be formed by removing material from the stack of layers through etching or mechanical techniques, or both.

Memory cell 310 (e.g., memory elements) may in some cases be formed by removing material from the conductive layer to create a recess adjacent to a via 340, and forming a variable resistance material in the recess. For example, material may be removed from the conductive layer by etching, and the variable resistance material may be deposited in the resulting recess to form a memory cell 310 (e.g., memory element). Each via 340 may be filled with electrical conductor materials and a dielectric material to create a pillar 355, which may be coupled (e.g., selectively) to a pillar row line 320 (e.g., a source line) via an exterior electrode 325. In other words, memory cells 310 in a memory cell stack 345 may share a common electrode (e.g., an exterior electrode 325). Thus, each memory cell 310 may be coupled with a word line 315 and an exterior electrode 325 of a pillar 355.

In some examples, a material of the memory cells 310 (e.g., memory elements) may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In), or a combination thereof, and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (CO, or fluorine (F), each in atomic or molecular forms. Other chalcogenide alloys not expressly recited here may also be employed.

In some examples, such as for thresholding memory cells or self-selecting memory cells 310, some or all of a set of logic states supported by the memory cells 310 may be associated with a same state, such as an amorphous state of the chalcogenide material as opposed to a crystalline state of the chalcogenide material (e.g., the material may be operable to store different or multiple logic states while remaining in an amorphous state). In some such examples, a memory cell 310 may be an example of a self-selecting memory cell 310. In such examples, the material used in the memory cell 310 may be based on an alloy (such as the alloys listed above) and may be operated so as to undergo a state change during normal operation of the memory cell (e.g., due to ion migration or segregation within the memory cell 310). For example, a self-selecting memory cell 310 may have a high threshold voltage state and a low threshold voltage state. A high threshold voltage state may correspond to a first logic state (e.g., a reset state) and a low threshold voltage state may correspond to a second logic state (e.g., a set state). In some examples, a memory cell 310 may alterative be switched between an amorphous and crystalline state during operation, which the amorphous and crystalline states corresponding to different resistances or threshold voltages and thus to different logic states, and such operation may in some cases be referred to as phase change operation.

In some cases, during a programming (write) operation of a self-selecting memory cell 310, a polarity of one or more pulses used for a write operation may influence (determine, set, program) a particular behavior or characteristic of the material of the memory cell 310, such as the threshold voltage of the material. The difference in threshold voltages of the material of the memory cell 310 depending on the logic state stored by the material of the memory cell 310 (e.g., the difference between the threshold voltage when the material is storing a logic state '0' versus a logic state '1') may correspond to a read window of the memory cell 310.

Various techniques may be used to form materials or components on a substrate 350. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

As described herein, regions separating memory cells 310, for example, insulating layers 305, may include one or more interfaces. In some examples, the interfaces separate memory cells 310 stacked in the vertical direction. In other words, memory cells 310 may be stacked one on top of the other and separated from one another by the interfaces.

The memory cells 310 described herein may include, but not be limited to, phase change materials. Other types of memory cells 310 may include, for example, resistive memory or resistive RAM. In some cases, resistive RAM may use metal oxide materials whose electrical resistance is varied by controlling the ionic state of atoms in the material or by controlling the number or location of atomic vacancies (e.g., missing atoms) in the material.

As described herein, a pillar 355 may include an exterior electrode 325 (e.g., a hollow exterior electrode 325) at least partially surrounding an inner dielectric 335, where the dielectric 335 may further at least partially surround an interior electrode 330 (e.g., a core electrode). In some cases, the interior electrode 330 may be maintained at a voltage level (e.g., a ground voltage). Such a pillar structure may increase a capacitance of the pillar 355, for example, based on a capacitive coupling between the interior electrode 330 and exterior electrode 325. The increased capacitance may increase one or more current associated with accessing memory cells associated with the pillar (e.g., coupled with the pillar), such as discharge currents that may occur through such memory cells when accessed, and thereby increase cell programming speed, programming reliability, and read disturb immunity (e.g., during an access operation). Additionally or alternatively, such a pillar structure may balance (e.g., more closely align or otherwise reduce differences between) capacitances associated with one type of access line within the memory device (e.g. word lines 315) and another type of access line within the memory die (e.g., pillars 355), which may support further optimizations or provide other benefits as may be appreciated by one of ordinary skill in the art.

Figure 4:
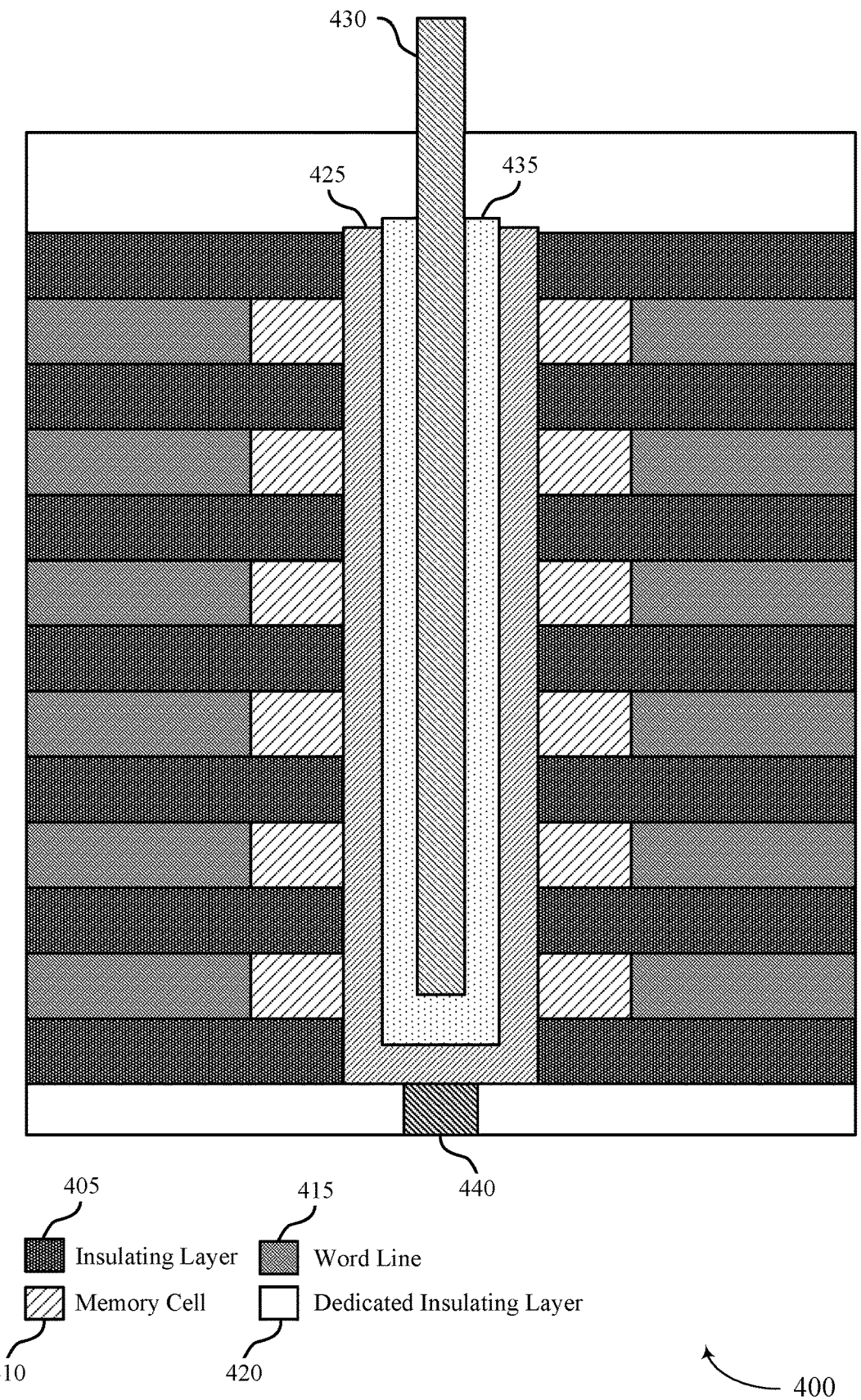
FIG. 4 illustrates an example of a device architecture that supports a capacitive pillar architecture for a memory array in accordance with examples as disclosed herein.

FIG. 4 illustrates an example of a device architecture 400 that supports a capacitive pillar architecture for a memory array in accordance with examples as disclosed herein. Device architecture 400 may represent a portion of a memory array of a memory device as described with reference to FIGS. 1-3. Device architecture 400 may include a stack of materials that includes insulating layers 405 and first layers that include respective memory cells 410 and word lines 415. For example, each memory cell 410 may be coupled with a respective word line 415 (e.g., a first electrode in a first layer) and an exterior electrode 425 (e.g., a second electrode) of a pillar. Each insulating layer 405 may be interposed between a corresponding set of two first layers (e.g., between layers that include word lines 415) and may electrically isolate the two first layers from each other. The device architecture 400 may also include dedicated insulating layers 420, where a first dedicated insulating layer 420 may be located at a top of the stack and a second dedicated insulating layer 420 may be located at a bottom of the stack.

A memory cell 410 coupled with the exterior electrode 425 may be accessed (e.g., for a read or write operation) by applying a first voltage to an associated word line 415 and applying a second voltage to the exterior electrode 425, where the memory cell may be coupled with the word line 415 and the exterior electrode 425. The second voltage may be applied to the exterior electrode 425 via another electrode (e.g., a pillar row line 320, which may alternatively be referred to as a source line), where a selection component 440 (e.g., a pillar selector 365, such as one or more transistors) may be configured to selectively couple the exterior electrode 425 with the other electrode. For example, a pillar line (e.g., a pillar column line 360) may be coupled with the selection component 440 (e.g., a gate of a transistor corresponding to or included in the selection component 440), and a voltage applied to the pillar line may activate the selection component 440 to couple the exterior electrode 425 with the other electrode, such that the second voltage may be applied to the exterior electrode 425 via the other electrode. Thus, the selection component 440 may, for example, be activated to couple the exterior electrode 425 with the other electrode, which may apply the second voltage to the exterior electrode 425. In some cases, the exterior electrode 425 may be considered an extension of the other electrode.

The exterior electrode 425 may form part of the pillar, where the pillar may include the exterior electrode 425, a dielectric 435 (e.g., a dielectric material), and an interior electrode 430 (e.g., a third electrode). In some cases, the exterior electrode 425 and the interior electrode 430 may be made of a same material, such as a tungsten material. In some cases, the exterior electrode 425 and the interior electrode 430 may be made of different materials. The dielectric 435 may be positioned between the exterior electrode 425 and the interior electrode 430 and may electrically isolate the exterior electrode 425 from the interior electrode 430. The exterior electrode 425 may at least partially surround (e.g., encircle or otherwise surround at least the sidewalls of) the dielectric 435 and the interior electrode 430, and the dielectric 435 may at least partially surround (e.g., encircle or otherwise surround at least the sidewalls of) the interior electrode 430 to isolate the exterior electrode 425 and the interior electrode 430.

A structure or shape of the pillar (e.g., and corresponding shapes of the exterior electrode 425, interior electrode 430, and dielectric 435) may be cylindrical, or may be another shape (e.g., rectangular). For example, device architecture 400 may illustrate an interior cross-section (e.g., a cross-sectional view) of the pillar and layers of the stack. A width of the exterior electrode 425 may be defined by or based on one or more dimensions of the memory array that includes device architecture 400. A width of the dielectric 435, a thickness of the dielectric 435, and a width of the interior electrode 430 may be based on a capacitance (e.g., a desired capacitance) of the pillar, such as a capacitance of the pillar when the second voltage is applied to access a memory cell 410. For example, a smaller thickness of the dielectric 435 may result in a higher capacitance for the pillar. A dielectric material and a dielectric constant (e.g., κ) of the dielectric 435 may also be based on the capacitance (e.g., desired capacitance) of the pillar. In some cases, the dielectric 435 represent a material that has a higher dielectric constant, such as a hafnium dioxide (HfO2) material.

Inclusion of the interior electrode 430 and the dielectric 435 in the pillar may increase a capacitance of the pillar, for example, in comparison to a pillar without the interior electrode 430 and the dielectric 435. The interior electrode 430 may be coupled with a voltage source that may apply a third voltage to the interior electrode 430 when accessing a memory cell via the exterior electrode 425. In some cases, the capacitance of the pillar (e.g., during the access operation) may be based on (e.g., configured based on) applying the third voltage to the interior electrode 430, the magnitude of the third voltage, the polarity of the third voltage, or any combination thereof. For example, the third voltage may represent a ground voltage (e.g., 0 volts (V), or a voltage close to 0 V) or may represent a positive or negative voltage level that may, for example, be used to achieve a certain pillar capacitance. The third voltage may be applied to the interior electrode 430 via an electrode line coupled with the interior electrode 430, where the electrode line may be coupled with multiple interior electrodes 430, such as interior electrodes 430 corresponding to all the pillars of a memory device or a group of pillars of the memory device. As such, the multiple interior electrodes 430 may be coupled with a common node having the third voltage.

A magnitude of discharge current discharge that occurs in response to (e.g., concurrent with) memory cell 410 selection may be based on applying the third voltage to the interior electrode 430 (e.g., the discharge current may have a magnitude that depends on the magnitude and polarity of the third voltage). The pillar may therefore experience an increased capacitance and discharge current (e.g., during an access operation involving the pillar) based on the interior electrode 430, the dielectric 435, and application of the third voltage. In some cases, the pillar may thus resemble, imitate, or mimic a cylindrical or other shaped capacitor. The increased capacitance of the pillar may be configured to have a capacitance level that does not damage memory cells 410 during access operations (e.g., from a higher capacitance), for example, based on characteristics of the exterior electrode 425, interior electrode 430, dielectric 435, and third voltage described herein. The increased capacitance of the pillar may increase a speed of current discharge for a memory cell 410 during an access operation, which may result in faster cell programming and higher reliability (e.g., for write operations), as well as a higher immunity to read disturbances (e.g., for read operations). The faster cell programming, higher reliability, and higher immunity may result in faster operations of the memory device, and may increase accuracy and data storage quality at the memory device.

Figure 5:
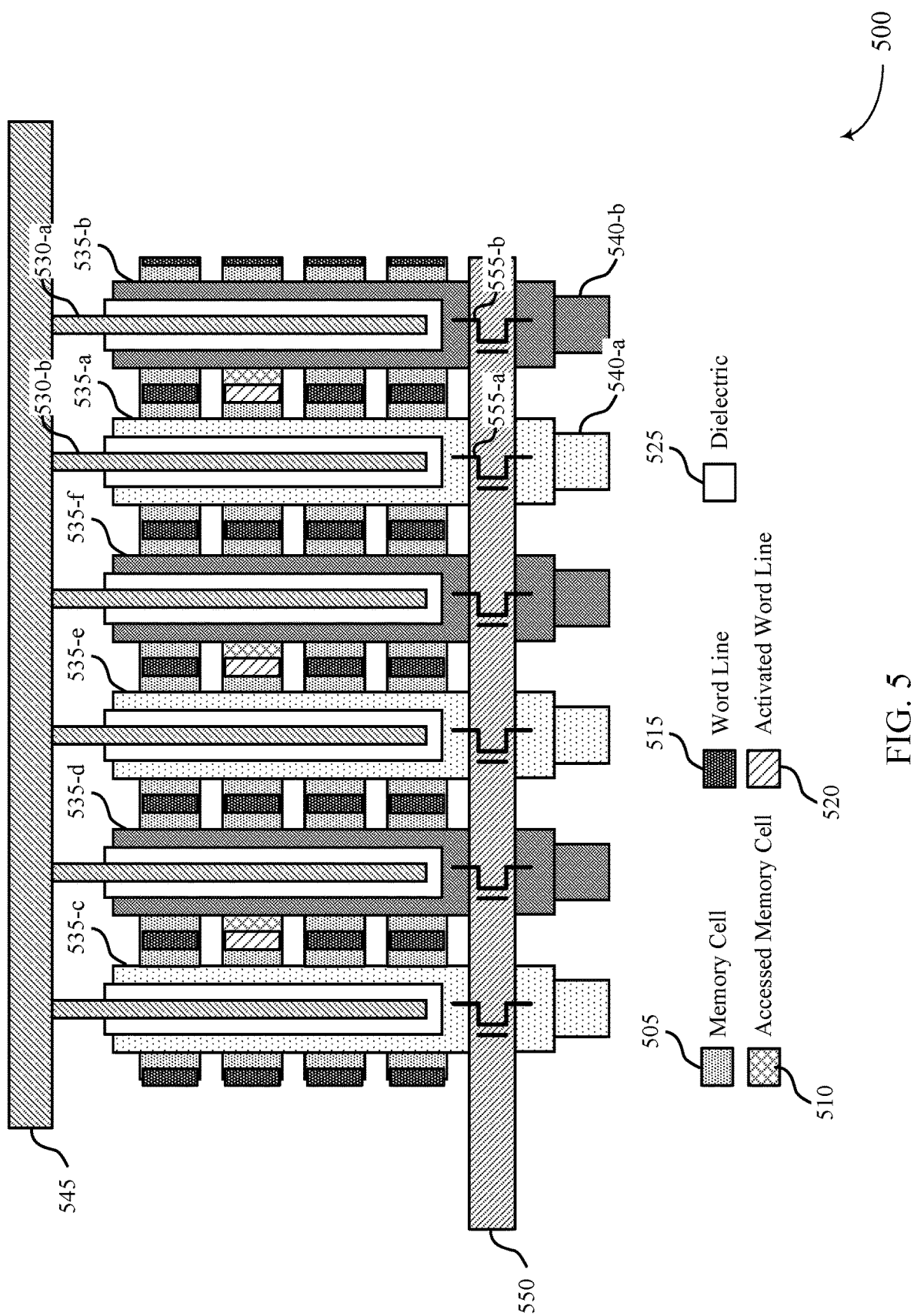
FIG. 5 illustrates an example of a device architecture that supports a capacitive pillar architecture for a memory array in accordance with examples as disclosed herein.

FIG. 5 illustrates an example of a device architecture 500 that supports a capacitive pillar architecture for a memory array in accordance with examples as disclosed herein. Device architecture 500 may represent a portion of a memory array of a memory device as described with reference to FIGS. 1-4. Device architecture 500 may include a stack of materials that includes insulating layers and first layers that include respective memory cells 505 and word lines 515. For example, each memory cell 505 may be coupled with a respective word line 515 (e.g., a first electrode in a first layer) and a respective exterior electrode 535 (e.g., a second electrode) of a pillar. As described elsewhere herein (e.g., with reference to FIGS. 3 and 4), the pillars may each include a respective exterior electrode 535, interior electrode 530, and dielectric 525.

The device architecture may also include an electrode line 545 (e.g., a first electrode line) that may be coupled with multiple interior electrodes 530 and a pillar line 550 (e.g., a second electrode line, which may in some examples be a pillar column line 360) that may be coupled with respective gates of multiple switching components 555 (e.g., selection components). A respective first terminal (e.g., drain) for each switching component 555 may be coupled with a respective exterior electrode 535, and a respective second terminal (e.g., source) for each switching component 555 may be coupled with a respective source line 540 (e.g., a fourth electrode, which may in some examples be a pillar row line 320). The word lines 515 and source lines 540 described herein and illustrated by device architecture 500 may be oriented such that they may extend in and out of the page.

A memory cell 505 coupled with an exterior electrode 535 may be accessed (e.g., for a read or write operation) by applying a first voltage to a word line 515 coupled with the memory cell and applying a second voltage to the exterior electrode 535. For example, a memory cell 510 coupled with exterior electrode 535-*b* may be accessed by activating a word line 520 coupled with the memory cell 510 (e.g., applying the first voltage to the word line 520) and activating exterior electrode 535-*b* (e.g., applying the second voltage to exterior electrode 535-*b*). The second voltage may be applied to exterior electrode 535-*b* via a switching component 555-*b* (e.g., a pillar selector or selection component).

For example, the pillar line 550 may be coupled with switching component 555-*b* (e.g., via a gate of switching component 555-*b*, among other switching components 555) and may activate switching component 555-*b* to couple exterior electrode 535-*b* with a source line 540-*b* (e.g., a fourth electrode or bit line). A switching component 555 may be an example of a pillar selector 365 or selection component 440. A fourth voltage, for example, may be applied to the pillar line 550, where the fourth voltage may activate the switching components 555 coupled with the pillar line 550. The second voltage (e.g., a negative voltage) may be applied to source line 540-*b*, such that activating switching component 555-*b* (e.g., via the pillar line 550) may couple the exterior electrode 535-*b* with source line 540-*b* and apply the second voltage to exterior electrode 535-*b*. As such, a memory cell 510 may be accessed based on an activated pillar line 550, activated source line 540, and activated word line 520.

In some cases, memory cells 510 associated with exterior electrodes 535-*d* and 535-*f* may also be accessed as part of the access operation (e.g., concurrently or sequentially to accessing the memory cell 510 coupled with exterior electrode 535-*b*). The same or similar processes may be used to access memory cells 510 associated with the other exterior electrodes 535.

As described herein, the pillar line 550 may activate all switching components 555 coupled with the pillar line 550 (e.g., including switching component 555-*a*). However, the memory cells 505 coupled with exterior electrode 535-*a* (e.g., among other exterior electrodes 535) may not be associated with the access operation. Accordingly, a voltage of a source line 540-*a* (e.g., a fifth voltage) may be maintained at a voltage that deselects exterior electrode 535-*a* (e.g., that does not affect memory cells 505 coupled with exterior electrode 535-*a*). In such cases, although switching component 555-*a* may be activated to couple exterior electrode 535-*a* with source line 540-*a*, the voltage of source line 540-*a* may restrict or limit access to the memory cells 505 coupled with exterior electrode 535-*a*. In some cases, memory cells 505 associated with exterior electrodes 535-*c* and 535-*e* may also be restricted or limited from being accessed as part of the access operation using the same or similar processes. In such cases, the unselected pillars or exterior electrodes 535 may be referred to as floating. Floating exterior electrodes 535 may, in some cases, charge slowly based on a capacitance of associated pillars, where the capacitance of a pillar may be based on the interior electrode 530, the dielectric 525, and other parameters described with reference to FIG. 4.

Interior electrodes 530 of the pillars described herein may be coupled with a voltage source that may apply or maintain a third voltage at the interior electrodes 530 (e.g., when accessing a memory cell 510). The third voltage may represent a ground voltage (e.g., 0 V, or a voltage close to 0 V) or may represent a positive or negative voltage level that may, for example, be used to achieve a certain pillar magnitude of discharge current for a pillar in response to (e.g., concurrent with) selecting a memory cell 505 associated with the pillar. The third voltage may be applied to the interior electrodes 530 via the electrode line 545, which may be coupled with the interior electrodes 530.

In some cases, the electrode line 545 may be coupled with all interior electrodes 530 (e.g., all the pillars) of a memory device. In some cases, the electrode line 545 may be coupled with a subset or group of interior electrodes 530 (e.g., a subset or group of pillars) of the memory device. For example, a tile, a patch, or a section of memory cells 505 (e.g., based on a partitioning scheme for a word line 515 or other access line, or based on a superset of such a partitioning scheme) may share a same electrode line 545 and may not share the electrode line 545 with other groups of pillars in the memory device. Segmenting electrode lines 545 in this way may support isolation of defects within the memory device, such as a hole in a dielectric 525. Segmenting electrode lines 545 may also support application of different voltage levels to different segments of electrode lines 545 and corresponding interior electrodes 530. In some cases, an electrode line 545 may include an anti-fuse to electrically isolate one or more first portions of the electrode line 545 from one or more second portions of the electrode line 545, such as when a defect is encountered in the one or more first portions or the one or more second portions.

Figure 6:
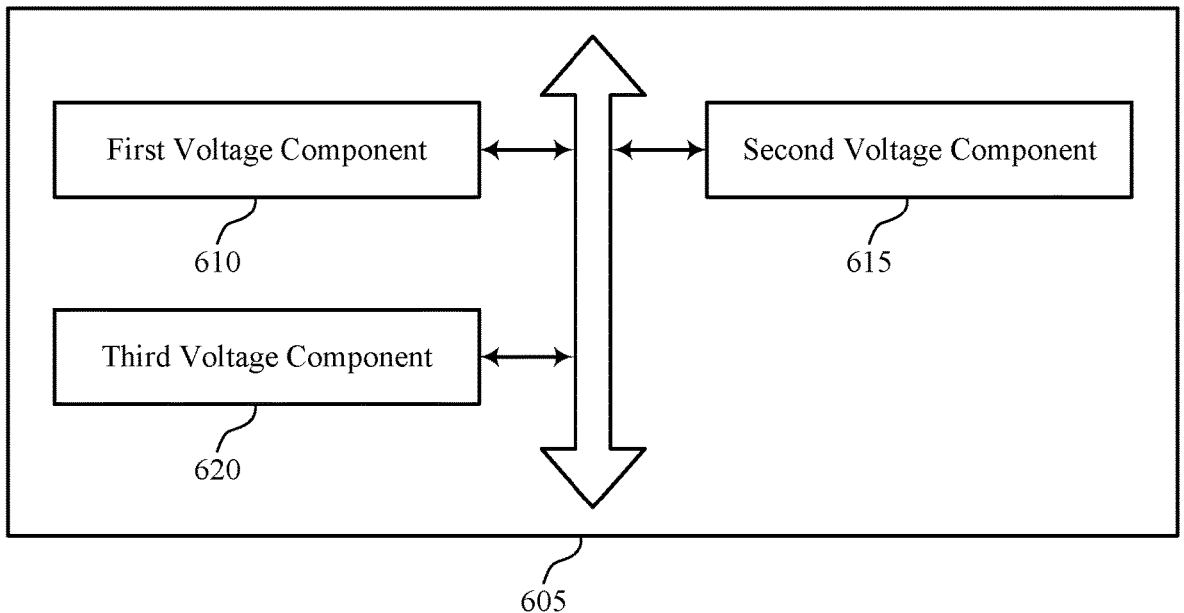
FIG. 6 shows a block diagram of a memory device that supports a capacitive pillar architecture for a memory array in accordance with aspects of the present disclosure.

FIG. 6 shows a block diagram 600 of a memory device 605 that supports a capacitive pillar architecture for a memory array in accordance with examples as disclosed herein. The memory device 605 may be an example of aspects of a memory device as described with reference to FIGS. 1-5. The memory device 605 may include a first voltage component 610, a second voltage component 615, and a third voltage component 620. Each of these modules may communicate, directly or indirectly, with one another (e.g., via one or more buses).

The first voltage component 610 may apply a first voltage to an electrode located at a first layer of a stack, the electrode coupled with a set of memory material elements located at the first layer.

The second voltage component 615 may access a memory material element of the set based on applying a second voltage to an exterior electrode of a pillar that extends through the stack, where the pillar includes the exterior electrode and an interior electrode at least partially surrounded by the exterior electrode, and where the exterior electrode is coupled with additional memory material elements located at additional layers of the stack. In some cases, the pillar includes a dielectric material interposed between the exterior electrode and the interior electrode, the dielectric material electrically isolating the exterior electrode from the interior electrode.

In some examples, the second voltage component 615 may apply the second voltage to a second electrode. In some examples, the second voltage component 615 may couple the second electrode with the exterior electrode via a switching component. In some examples, the second voltage component 615 may apply a fourth voltage to an electrode line coupled with the switching component, where coupling the second electrode with the exterior electrode is based on applying the fourth voltage. In some examples, the second voltage component 615 may apply the fourth voltage to a second switching component via the electrode line, the second switching component coupled with a second exterior electrode of a second pillar. In some examples, the second voltage component 615 may apply a fifth voltage to a third electrode coupled with the second switching component to isolate the second exterior electrode of the second pillar from the second electrode.

The third voltage component 620 may maintain the interior electrode of the pillar at a third voltage at least partially concurrently with the second voltage component 615 applying the second voltage. In some examples, the third voltage component 620 may maintain a second electrode line coupled with the interior electrode at the third voltage while applying the first voltage. In some cases, a current associated with accessing the memory material element is based on maintaining the interior electrode at the third voltage. In some cases, a characteristic of the second voltage is based on maintaining the interior electrode at the third voltage. In some cases, the third voltage may be a ground voltage.

Figure 7:
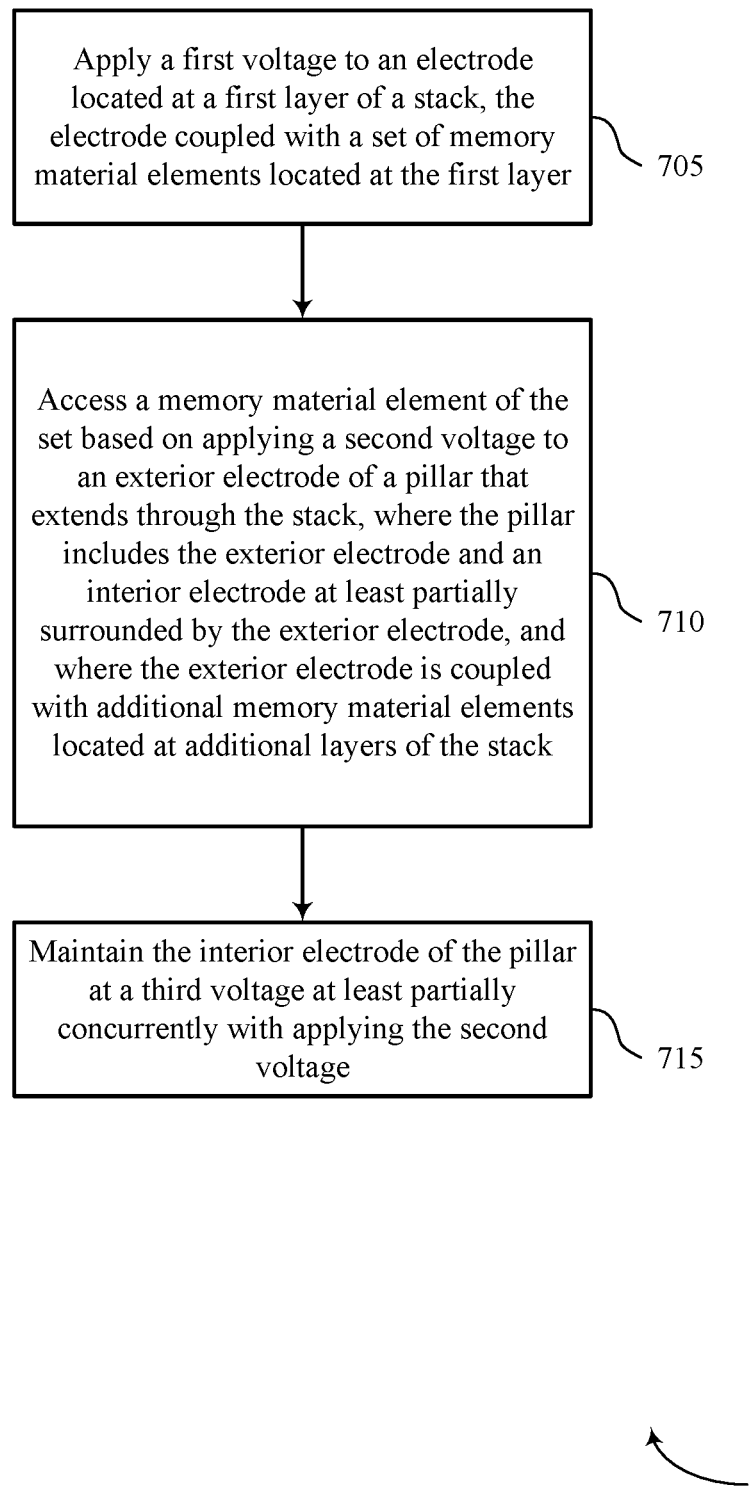
FIG. 7 shows a flowchart illustrating a method or methods that support capacitive pillar architecture for a memory array in accordance with examples as disclosed herein.

FIG. 7 shows a flowchart illustrating a method or methods 700 that supports a capacitive pillar architecture for a memory array in accordance with aspects of the present disclosure. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 705, the memory device may apply a first voltage to an electrode located at a first layer of a stack, the electrode coupled with a set of memory material elements located at the first layer. The operations of 705 may be performed according to the methods described herein. In some examples, aspects of the operations of 705 may be performed by a first voltage component as described with reference to FIG. 6.

At 710, the memory device may access a memory material element of the set based on applying a second voltage to an exterior electrode of a pillar that extends through the stack, where the pillar includes the exterior electrode and an interior electrode at least partially surrounded by the exterior electrode, and where the exterior electrode is coupled with additional memory material elements located at additional layers of the stack. The operations of 710 may be performed according to the methods described herein. In some examples, aspects of the operations of 710 may be performed by a second voltage component as described with reference to FIG. 6.

At 715, the memory device may maintain the interior electrode of the pillar at a third voltage at least partially concurrently with applying the second voltage. The operations of 715 may be performed according to the methods described herein. In some examples, aspects of the operations of 715 may be performed by a third voltage component as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for applying a first voltage to an electrode located at a first layer of a stack, the electrode coupled with a set of memory material elements located at the first layer, accessing a memory material element of the set based on applying a second voltage to an exterior electrode of a pillar that extends through the stack, where the pillar includes the exterior electrode and an interior electrode at least partially surrounded by the exterior electrode, and where the exterior electrode is coupled with additional memory material elements located at additional layers of the stack, and maintaining the interior electrode of the pillar at a third voltage at least partially concurrently with applying the second voltage.

In some examples of the method 700 and the apparatus described herein, the pillar includes a dielectric material interposed between the exterior electrode and the interior electrode, the dielectric material electrically isolating the exterior electrode from the interior electrode. In some examples of the method 700 and the apparatus described herein, a current associated with accessing the memory material element may be based on maintaining the interior electrode at the third voltage. In some examples of the method 700 and the apparatus described herein, a characteristic of the second voltage may be based on maintaining the interior electrode at the third voltage.

In some examples of the method 700 and the apparatus described herein, operations, features, means, or instructions for applying the second voltage to the exterior electrode may include operations, features, means, or instructions for applying the second voltage to a second electrode, and coupling the second electrode with the exterior electrode via a switching component.

Some examples of the method 700 and the apparatus described herein may further include operations, features, means, or instructions for applying a fourth voltage to an electrode line coupled with the switching component, where coupling the second electrode with the exterior electrode may be based on applying the fourth voltage. Some examples of the method 700 and the apparatus described herein may further include operations, features, means, or instructions for applying the fourth voltage to a second switching component via the electrode line, the second switching component coupled with a second exterior electrode of a second pillar, and applying a fifth voltage to a third electrode coupled with the second switching component to isolate the second exterior electrode of the second pillar from the second electrode.

In some examples of the method 700 and the apparatus described herein, operations, features, means, or instructions for applying the third voltage to the interior electrode may include operations, features, means, or instructions for maintaining a second electrode line coupled with the interior electrode at the third voltage while applying the first voltage. In some examples of the method 700 and the apparatus described herein, the third voltage may be a ground voltage.

It should be noted that the methods described herein describe possible implementations, and that the operations and the steps may be rearranged or otherwise modified and that other implementations are possible. Further, portions from two or more of the methods may be combined.

An apparatus is described. The apparatus may include a stack including a set of first layers, each first layer including a respective memory material element of a set of memory material elements coupled with a respective first electrode of a set of first electrodes, a pillar extending through the set of first layers and coupled with the set of memory material elements, where a memory material element of the set of memory material elements is operable to be accessed based on a voltage difference between the pillar and the respective first electrode, and where the pillar includes a second electrode, a third electrode at least partially surrounding the second electrode and coupled with the set of memory material elements, and a dielectric material interposed between the second electrode and the third electrode, the dielectric material electrically isolating the second electrode from the third electrode.

In some examples, the stack further may include a set of second layers, each second layer interposed between a corresponding set of two first layers of the set of first layers and configured to isolate one first layer of the set of two first layers from another first layer of the set of two first layers.

In some examples, each first layer further may include a respective second memory material element of a plurality of second memory material elements coupled with the respective first electrode, and the apparatus further may include a second pillar extending through the set of first layers and coupled with the set of second memory material elements, where a second memory material element of the set of second memory material elements may be operable to be accessed based on a voltage difference between the second pillar and the respective first electrode, the second pillar including an additional second electrode, an additional third electrode at least partially surrounding the additional second electrode of the second pillar and coupled with the set of second memory material elements, and the dielectric material interposed between the additional second electrode and the additional third electrode of the second pillar, the dielectric material of the second pillar electrically isolating the additional second electrode of the second pillar from the additional third electrode of the second pillar.

Some examples of the apparatus further may include a fourth electrode, where the fourth electrode may be coupled with the second electrode of the pillar and the additional second electrode of the second pillar, and where the fourth electrode may be configured to maintain the second electrodes at a first voltage during at least part of an access operation. In some examples, the first voltage may be a ground voltage.

In some examples, a capacitance of the pillar may be based on a thickness of the dielectric material and a dielectric constant of the dielectric material. Some examples of the apparatus further may include a switching component coupled with the third electrode, and a fifth electrode coupled with the switching component, where accessing the memory material element may be based on activating the switching component to apply a second voltage from the fifth electrode to the third electrode. Some examples of the apparatus further may include a sixth electrode coupled with the switching component, where the switching component may be configured to become activated based on a voltage applied to the sixth electrode.

An apparatus is described. The apparatus may include a stack including a set of first layers, each first layer including a respective first electrode of a set of first electrodes coupled with a corresponding set of memory material elements, and a pillar extending through the set of first layers and coupled with a respective first memory material element at each first layer, the pillar including an interior electrode, an exterior electrode at least partially surrounding the interior electrode and coupled with the respective first memory material elements. The apparatus may also include a controller operable to apply a first voltage to an electrode of the set of first electrodes, access a memory material element of the first memory material elements based on applying a second voltage to the exterior electrode, and maintain the interior electrode at a third voltage at least partially concurrently with applying the second voltage.

In some examples, the pillar further may include a dielectric material interposed between the exterior electrode and the interior electrode, the dielectric material electrically isolating the exterior electrode from the interior electrode. In some examples, a capacitance of the pillar may be based on a thickness of the dielectric material and a dielectric constant of the dielectric material.

Some examples of the apparatus further may include a second pillar extending through the set of first layers and coupled with a respective second memory material element at each first layer, the second pillar including a second interior electrode, a second exterior electrode at least partially surrounding the second interior electrode and coupled with the second memory material elements, and a second dielectric material interposed between the second interior electrode and the second exterior electrode, the second dielectric material electrically isolating the second interior electrode from the second exterior electrode. Some examples of the controller further may be operable to float the second exterior electrode at least partially concurrently with applying the second voltage to the exterior electrode.

Some examples of the apparatus further may include a second electrode, and a switching component coupled with the second electrode and the exterior electrode, where the controller may be further operable to apply the second voltage to the second electrode and couple the second electrode with the exterior electrode via the switching component, where applying the second voltage to the exterior electrode is based on applying the second voltage to the second electrode and coupling the second electrode with the exterior electrode.

Some examples of the apparatus further may include an electrode line coupled with a set of switching components that includes the switching component, where the controller may be further operable to apply a fourth voltage to the electrode line, where coupling the second electrode with the exterior electrode is based on applying the fourth voltage. In some examples, a current associated with accessing the memory material element, a characteristic of the second voltage, or both, may be based on maintaining the interior electrode at the third voltage.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a stack comprising a plurality of first layers, each first layer comprising a respective memory material element of a plurality of memory material elements coupled with a respective first electrode of a plurality of first electrodes; and
a pillar extending through the plurality of first layers and coupled with the plurality of memory material elements, wherein the pillar comprises:
a second electrode;
a third electrode coupled with the plurality of memory material elements, wherein the third electrode at least partially surrounds the second electrode; and
a dielectric material interposed between the second electrode and the third electrode.

2. The apparatus of claim 1, wherein a capacitance of the pillar is based at least in part on a capacitive coupling between the second electrode and the third electrode.

3. The apparatus of claim 2, wherein a memory material element of the plurality of memory material elements is operable to be accessed based at least in part on applying a voltage to the third electrode.

4. The apparatus of claim 3, wherein the memory material element of the plurality of memory material elements is operable to be accessed further based at least in part on a voltage difference between the third electrode and the respective first electrode for the memory material element.

5. The apparatus of claim 1, wherein each first layer further comprises a respective second memory material element of a plurality of second memory material elements coupled with the respective first electrode, further comprising:
a second pillar extending through the plurality of first layers and coupled with the plurality of second memory material elements, the second pillar comprising:
an additional second electrode;
an additional third electrode coupled with the plurality of second memory material elements; and
the dielectric material interposed between the additional second electrode and the additional third electrode of the second pillar.

6. The apparatus of claim 1, further comprising:
a switching component coupled with the third electrode; and
a fourth electrode coupled with the switching component, wherein accessing a memory material element of the plurality of memory material elements is based at least in part on activating the switching component to apply a voltage from the fourth electrode to the third electrode.

7. The apparatus of claim 1, further comprising:
a fifth electrode coupled with the second electrode of the pillar, wherein the fifth electrode is configured to maintain the second electrode of the pillar at a voltage during at least part of an access operation for a memory material element of the plurality of memory material elements.

8. A method, comprising:
applying a first voltage to a first electrode located at a first layer of a stack, the first electrode coupled with a plurality of memory material elements located at the first layer;
accessing a memory material element of the plurality of memory material elements based at least in part on applying a second voltage to a third electrode of a pillar that extends through the stack, wherein the pillar comprises the third electrode and a second electrode, and wherein the third electrode is coupled with additional memory material elements located at additional layers of the stack; and
maintaining the second electrode of the pillar at a third voltage at least partially concurrently with applying the second voltage.

9. The method of claim 8, wherein a capacitance of the pillar is based at least in part on the second voltage being applied to the third electrode while the second electrode is maintained at the third voltage.

10. The method of claim 9, wherein a current associated with accessing the memory material element is based at least in part on the capacitance of the pillar.

11. The method of claim 8, wherein the pillar further comprises a dielectric material interposed between the third electrode and the second electrode.

12. The method of claim 8, wherein a characteristic of the second voltage is based at least in part on maintaining the second electrode at the third voltage.

13. The method of claim 8, wherein the third electrode at least partially surrounds the second electrode.

14. The method of claim 8, wherein applying the second voltage to the third electrode comprises:
applying the second voltage to a fourth electrode; and
coupling the fourth electrode with the third electrode via a switching component.

15. The method of claim 8, wherein maintaining the second electrode at the third voltage comprises:
maintaining an electrode line coupled with the second electrode at the third voltage.

16. An apparatus, comprising:
a stack comprising a plurality of first layers, each first layer comprising a respective first electrode of a plurality of first electrodes coupled with a corresponding plurality of memory material elements;
a pillar extending through the plurality of first layers and coupled with a respective first memory material element at each first layer, the pillar comprising:
a second electrode; and
a third electrode coupled with the respective first memory material elements; and
a controller operable to;
apply a first voltage to an electrode of the plurality of first electrodes;
access a memory material element of the respective first memory material elements based at least in part on applying a second voltage to the third electrode; and
maintain the second electrode at a third voltage at least partially concurrently with applying the second voltage.

17. The apparatus of claim 16, wherein the pillar further comprises a dielectric material interposed between the third electrode and the second electrode.

18. The apparatus of claim 16, wherein the third electrode at least partially surrounds the second electrode.

19. The apparatus of claim 16, further comprising:
a second pillar extending through the plurality of first layers and coupled with a respective second memory material element at each first layer, the second pillar comprising:
an additional second electrode; and
an additional third electrode coupled with the respective second memory material elements, wherein the controller is further operable to:
float the additional third electrode at least partially concurrently with applying the second voltage to the third electrode.

* * * * *